United States Patent
Nakajima

(10) Patent No.: US 7,766,507 B2
(45) Date of Patent: Aug. 3, 2010

(54) ILLUMINATION LIGHT SOURCE AND IMAGE PROJECTOR

(75) Inventor: Yasuharu Nakajima, Yokohama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 12/453,773

(22) Filed: May 21, 2009

(65) Prior Publication Data

US 2009/0231846 A1  Sep. 17, 2009

Related U.S. Application Data

(63) Continuation of application No. PCT/JP2007/073217, filed on Nov. 30, 2007.

(30) Foreign Application Priority Data

Dec. 5, 2006  (JP) ............................. 2006-327966

(51) Int. Cl.
*F21V 1/00* (2006.01)
(52) U.S. Cl. ...................... 362/237; 362/227; 362/241; 362/294; 359/237; 359/850; 359/855
(58) Field of Classification Search ................ 362/227, 362/235, 237, 241, 294, 373, 551, 555, 800; 359/237, 247–248, 263, 850, 855–857
See application file for complete search history.

(56) References Cited

FOREIGN PATENT DOCUMENTS

| | | |
|---|---|---|
| JP | A-2003-100110 | 4/2003 |
| JP | B2-3585097 | 11/2004 |
| JP | A-2005-91383 | 4/2005 |
| JP | A-2005-228695 | 8/2005 |
| JP | A-2005-347224 | 12/2005 |
| JP | A-2006-221954 | 8/2006 |

*Primary Examiner*—Sandra L O'Shea
*Assistant Examiner*—Meghan K Dunwiddie
(74) *Attorney, Agent, or Firm*—Miles & Stockbridge P.C.

(57) ABSTRACT

A light beam emitted from a light source (11) impinges on the spherical surface (20a) of a collimator lens (20) substantially perpendicularly thereto. A light beam making a small angle to the optical axis impinges on the ellipsoid (20c) and then it is refracted. The ellipsoid (20c) converts light beams diverging from a light source located at the first focal point thereof into parallel light beams. A light beam making a large angle to the optical axis impinges on an ellipsoid (20b) and then it is reflected totally off the ellipsoid (20b). A light beam diverging from a light source located at the first focal point of the ellipsoid (20b) is converted into a light beam being focused on the second focal point thereof. An ellipsoid (20d) converts the light beams focused on the second focal point thereof into parallel light beams. In this way, the light beams emitted from the light source (11) are converted into substantially parallel light beams by the collimator lens (20), thus providing an illuminator exhibiting high directivity, high efficiency and high uniformity in light quantity distribution.

8 Claims, 6 Drawing Sheets

ILLUMINATION LIGHT SOURCE AND IMAGE PROJECTOR

TECHNICAL FIELD

The present invention relates to an illumination light source and an image projector.

BACKGROUND ART

Instead of conventional metal halide lamps or high-pressure mercury lamps, there is proposed use of a solid-state light-emitting device, particularly Light-Emitting Diode (hereinafter referred to as an "LED") as a light source of a projector that is of an image display apparatus. The LED offers advantages in that miniaturization and low power consumption can be achieved in the projector, and it has a long life compared with metal halide lamps or high-pressure mercury lamps that are of conventional light sources. However, the LED has a smaller light-emission quantity. Therefore, as disclosed in Japanese Patent No. 3585097 (Patent Document 1), plural LED light sources may be arrayed to ensure a sufficient light quantity.

However, it is known that an available light flux is not increased in the whole optical system due to the following reason when the number of light sources exceeds a predetermined number. An etendue that is of a product of an area S in which the available light flux exists and a solid angle $\Omega$ is conserved in the optical system such as in the projector. Examples of optical modulators currently used in the projector include an LCD (Liquid Crystal Display), an LCOS (Liquid Crystal On Silicon), and a DMD (Digital Micro-mirror Device). There is a restriction to an effective angle in the optical modulators currently used in the projector, and modulation cannot be performed to the light flux that is incident to the optical modulator with an angle exceeding the effective angle. It is also difficult to expand the effective angle in devices such as a polarizing prism and a dichroic mirror that are used in the projector optical system. Therefore, there is the restriction in the solid angle $\Omega$ of the light flux that is effectively used in the optical devices. Further, it is clear that the area S of the light flux passing through each device depends on a size of the device. However, the area S cannot be increased in order to downsize the apparatus.

On the other hand, the etendue of the light diffused from the light source is proportional to the total area of the light source, that is, the number of light sources. However, when the etendue of the light source exceeds a minimum etendue of each optical device, the excess light flux cannot effectively be used. This is the reason why the available light flux is not increased even if the number of light sources is increased over a predetermined number.

Desirably the etendue of the individual LED light source is decreased as much as possible in the configuration in which LEDs are arrayed. For example, in a projector disclosed in Japanese Patent Application Laid-Open No. 2006-221954 (Patent Document 2), there is proposed an LED where an intensity distribution of the light exiting from the chip has directivity to decrease the solid angle of the light flux diffused from the light source, thereby suppressing the etendue.

In the projector optical system, generally illuminance homogeneity of a projected image is improved with homogenization means (integrator) for substantially homogenizing a light quantity distribution of the light emitted from the light source. In the projector disclosed in Patent Document 2, a rod integrator is used as the homogenization means. Light incident to the rod integrator is repeatedly total-reflected on inner surfaces of the rod integrator, and the light exits from the exit surface that is opposite to the incident surface. At this point, a surface light source having a homogeneous light intensity distribution is formed in the exit surface. In other words, the exit surface is illuminated in a superimposed manner with the light beams from virtual images of plural light sources that are formed across the incident surface by the internal reflection.

Patent Document 1: Japanese Patent No. 3585097
Patent Document 2: Japanese Patent Application Laid-Open No. 2006-221954

According to the configuration disclosed in Patent Document 1, a length L enough to homogenize the light quantity distribution of the rod integrator that is used as the homogenization means for homogenizing the light quantity distribution is expressed by Expression (3):

$$L \geq P/\tan\theta \qquad (3)$$

where P is a space between adjacent LEDs and $\theta$ is an angle from an optical axis at a position in which the intensity of the light emitted from each LED becomes a half of the intensity on the optical axis.

As is clear from Expression (3), the length L of the rod integrator depends on a divergent angle of the light flux incident to the rod integrator. Accordingly, as the directivity of the light flux is increased, the light flux is hardly dispersed and multiple reflections are hardly generated in the rod integrator. Therefore, the length necessary for the homogenization is increased. When the directivity of the individual light source is enhanced to effectively use the light flux while LEDs are arrayed, the rod integrator necessary to homogenize the light quantity distribution is enlarged, and therefore the apparatus is enlarged. Accordingly, the LED advantage of the miniaturization cannot be utilized.

In view of the foregoing, an object of the invention is to provide a compact illumination apparatus having a high directivity and a high homogeneity of light quantity distribution on the light-emitting surface and an image projector in which the illumination apparatus is used.

SUMMARY OF THE INVENTION

A first aspect of the invention provides an illumination light source in which plural solid-state light-emitting devices having a refractive index $n_1$ and plural optical members having a refractive index $n_2$ are arrayed, each of the optical members converting a light flux emitted from the corresponding one of the solid-state light-emitting devices into substantially parallel light, wherein said each of the optical members includes: a first ellipsoid having focal points of a first point and a second point, the first point being located in a center of the corresponding one of the solid-state light-emitting devices, the second point being different from the first point, the second point being located at a position advanced from the first point in a direction in which the light flux propagates; a second ellipsoid having focal points of the first point and a third point, the third point being different from the first point, the third point being located at a position advanced from the first point in the direction in which the light flux propagates; and a third ellipsoid having focal points of the second point and a fourth point, the fourth point being different from the second point, the fourth point being located on a light source side of the second point, wherein Expression (1) is satisfied:

$$\frac{1-e_2}{1+e_2} = \frac{1-e_3}{1+e_3} = \frac{n_2-1}{n_2+1} \quad (1)$$

where $e_2$ is an eccentricity of the second ellipsoid and $e_3$ is an eccentricity of the third ellipsoid.

A second aspect of the invention is the illumination light source according to the first aspect, wherein n satisfies Expression (2):

$$n_1 \geq n \geq n_2 \quad (2)$$

where n is a refractive index of a medium with which a gap between said each of the optical members and the corresponding one of the solid-state light-emitting devices is filled.

A third aspect of the invention is the illumination light source according to the first aspect or the second aspect, wherein the illumination light source is disposed on a non-metallic radiator board.

A fourth aspect of the invention is the illumination light source according to the third aspect, wherein the non-metallic radiator board is an oriented graphite sheet, and an integrated array including the solid-state light-emitting devices and the optical members is bonded onto the oriented graphite sheet with a thermal conductive resin.

A fifth aspect of the invention is the illumination light source according to any of the first aspect to the fourth aspect, wherein said each of the optical members is a heat-resistant resin optical member, and the plural optical members are bonded into an integrated array shape with a thermal conductive resin.

A sixth aspect of the invention is the illumination light source according to any one of the first aspect to the fifth aspect, wherein the heat-resistant resin optical member is one of heat-resistant acryl, polycarbonate, polyethylene terephthalate, and cycloolefin polymer.

A seventh aspect of the invention is the illumination light source according to any one of the first aspect to the sixth aspect further including a rod integrator.

An eighth aspect of the invention provides an image projector that projects an image according to input image information, the image projector including: an illumination light source according to any one of the first aspect to the seventh aspect; a spatial modulator that modulates an image according to the input image information; an illumination optical system that guides illumination light emitted from the illumination light source to illuminate the spatial modulator; and a projection optical system that projects the image modulated by the spatial modulator illuminated with the illumination optical system.

Accordingly, the invention can provide the illumination apparatus having the high directivity, the high efficiency, and the high homogeneity of the light quantity distribution and the image projector in which the illumination apparatus is used.

DETAILED DESCRIPTION OF THE PREFERRED EMBODIMENTS OF THE INVENTION

Figure 1:
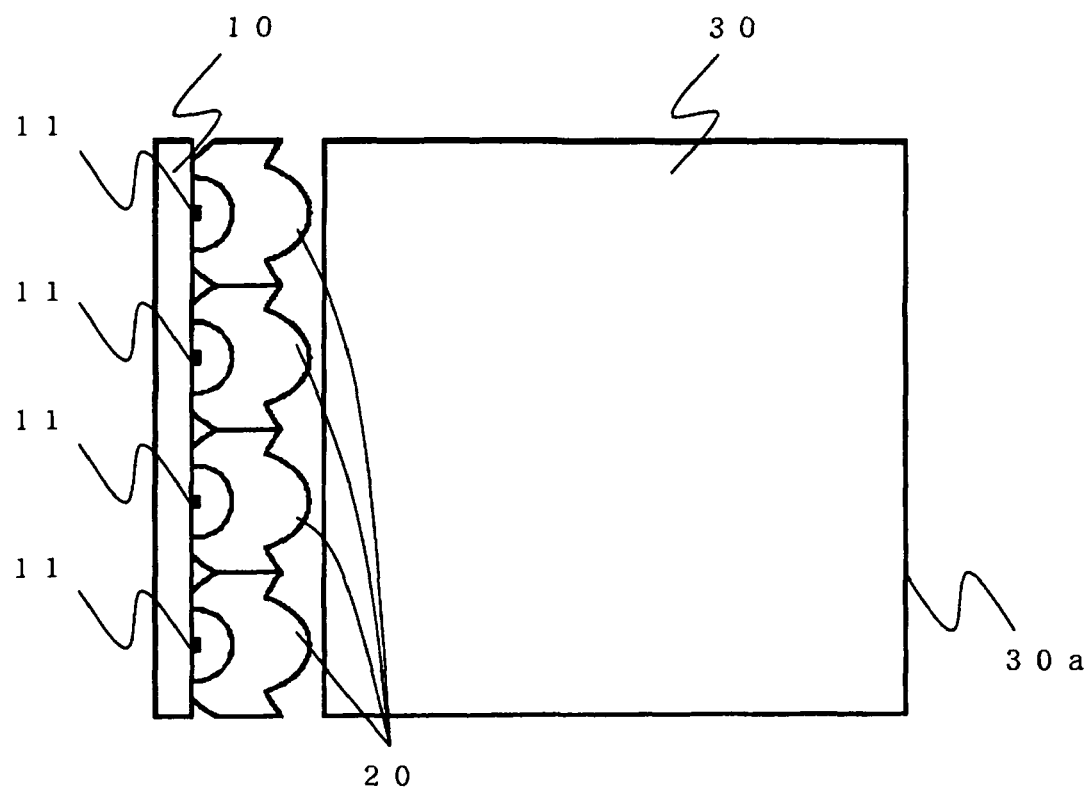
FIG. 1 is a view showing an outline of an illumination apparatus according to a first embodiment of the invention.

Embodiments of the invention will be described with reference to the drawings. In the drawings, the same or corresponding component is designated by the same numeral, and sometimes repeated description will be omitted.

FIG. 1 is a view showing an illumination apparatus according to a first embodiment of the invention. Plural LEDs 11 are collected and arrayed on a board 10.

A collimator lens 20 is made of an optical heat-resistant resin such as heat-resistant acryl, polycarbonate, polyethylene terephthalate, and cycloolefin polymer.

The board 10 is an oriented graphite sheet, and an integrated array including LEDs 11 and collimator lenses 20 is bonded onto the oriented graphite sheet using a thermal conductive resin. The collimator lenses 20 are bonded into an integrated array shape with a thermal conductive resin.

The oriented graphite sheet has a thermal conductivity of 400 to 1700 W/(m·K). Although copper has an excellent thermal conductivity of 390 W/(m·K), the thermal conductivity of the oriented graphite sheet is larger than that of copper. A specific gravity of the oriented graphite sheet is one ninth that of copper. Therefore, a lightweight illumination light source having an excellent radiation performance can be implemented.

As the thermal conductive resin, one made of a thermosetting resin in which an inorganic filler having an excellent thermal conductivity is dispersed can be used. For example, $Al_2O_3$, MgO, BN, SiC, $Si_3N_4$, and AlN having excellent thermal conductivities are used as the inorganic filler. As the thermo-setting resin, for example, an epoxy resin, a phenol resin, and a cyanate resin can be used.

LEDs 11 each of which has a light emitting area of 0.3 mm×0.3 mm are arrayed into a 4-by-4 lattice shape, and a space P between adjacent LEDs is 4 mm.

The light emitted from the LED array is converted into the light having directivity by the collimator lenses 20 each of which collimates the light emitted from the corresponding one of the LEDs 11. A medium of the collimator lenses 20 has a refractive index $n_2$ of 1.515. The LEDs 11 as the light source have a refractive index $n_1$ of 2.54.

Figure 2:
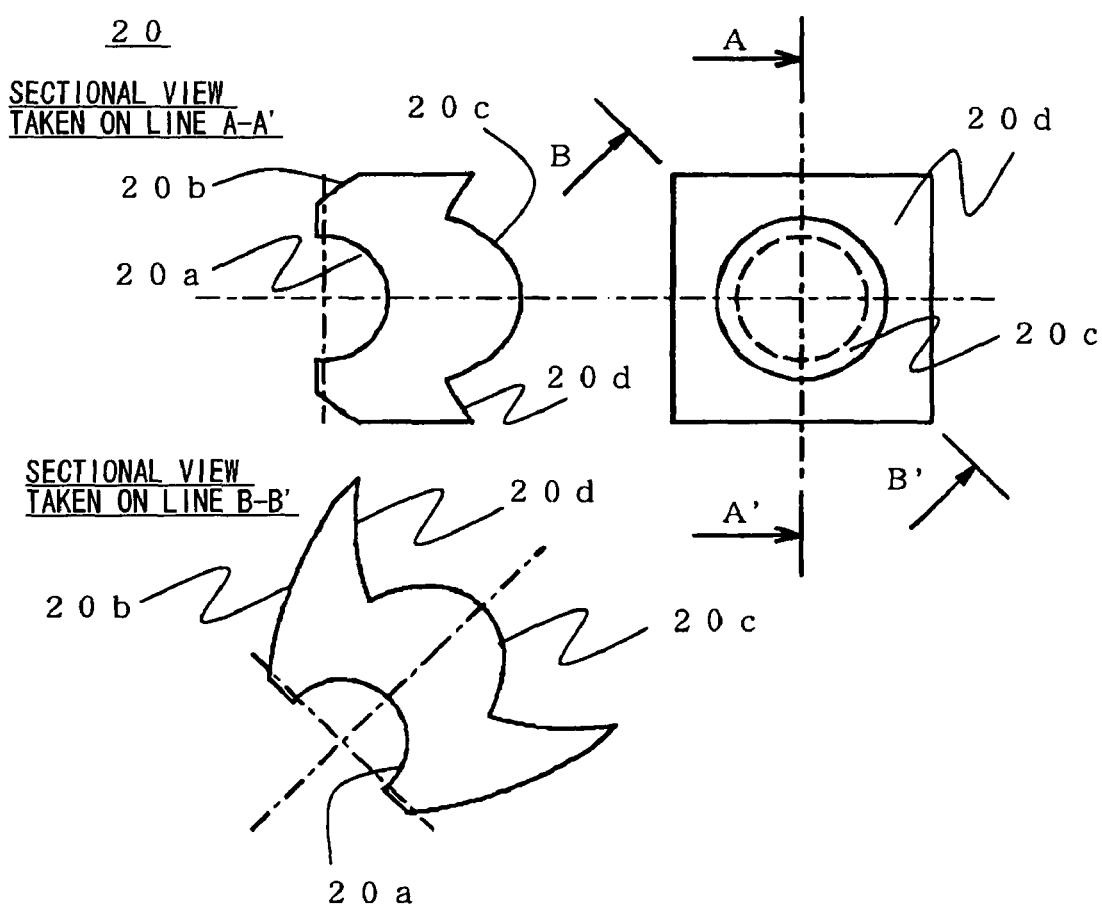
FIG. 2 is a view showing an outline of a collimator lens of the first embodiment.

FIG. 2 is a view showing a shape of each collimator lens 20. Each collimator lens 20 includes a spherical surface 20a, an ellipsoid 20b (a first ellipsoid), an ellipsoid 20c (a second ellipsoid), and an ellipsoid 20d (a third ellipsoid). A focal point of each ellipsoid is located on an optical axis. The collimator lens 20 has a size of 4 mm×4 mm. At this point, it is assumed that an origin is set at the center of the LED 11 that is of the light source, and two focal points of each ellipsoid located on the optical axis are referred to as a first focal point and a second focal point in the order they are closer to the origin.

The spherical surface 20a has a radius of 1.25 mm, and the center of the spherical surface is located at the origin.

The first focal point of the ellipsoid 20b is located at the origin, the second focal point is located at a distance of 10.27 mm from the origin, and the ellipsoid 20b has a major axis of 12 mm.

The first focal point of the ellipsoid 20c is located at the origin, the second focal point is located at a distance of 2.44 mm from the origin, and the ellipsoid 20c has a major axis of 3.72 mm. The first focal point of the ellipsoid 20d is located at a distance of 3.41 mm from the origin, the second focal point is located at a distance of 10.27 mm from the origin (the same position as that of ellipsoid 20b), and the ellipsoid 20d has a major axis of 10.47 mm. At this point, the ellipsoid 20c has an eccentricity $e_2$ of 0.66 while the ellipsoid 20d has an eccentricity $e_3$ of 0.66, and Expression (1) described below is satisfied in the ellipsoid 20c and the ellipsoid 20d.

$$\frac{1-e_2}{1+e_2} = \frac{1-e_3}{1+e_3} = \frac{n_2-1}{n_2+1} \quad (1)$$

Figure 3:
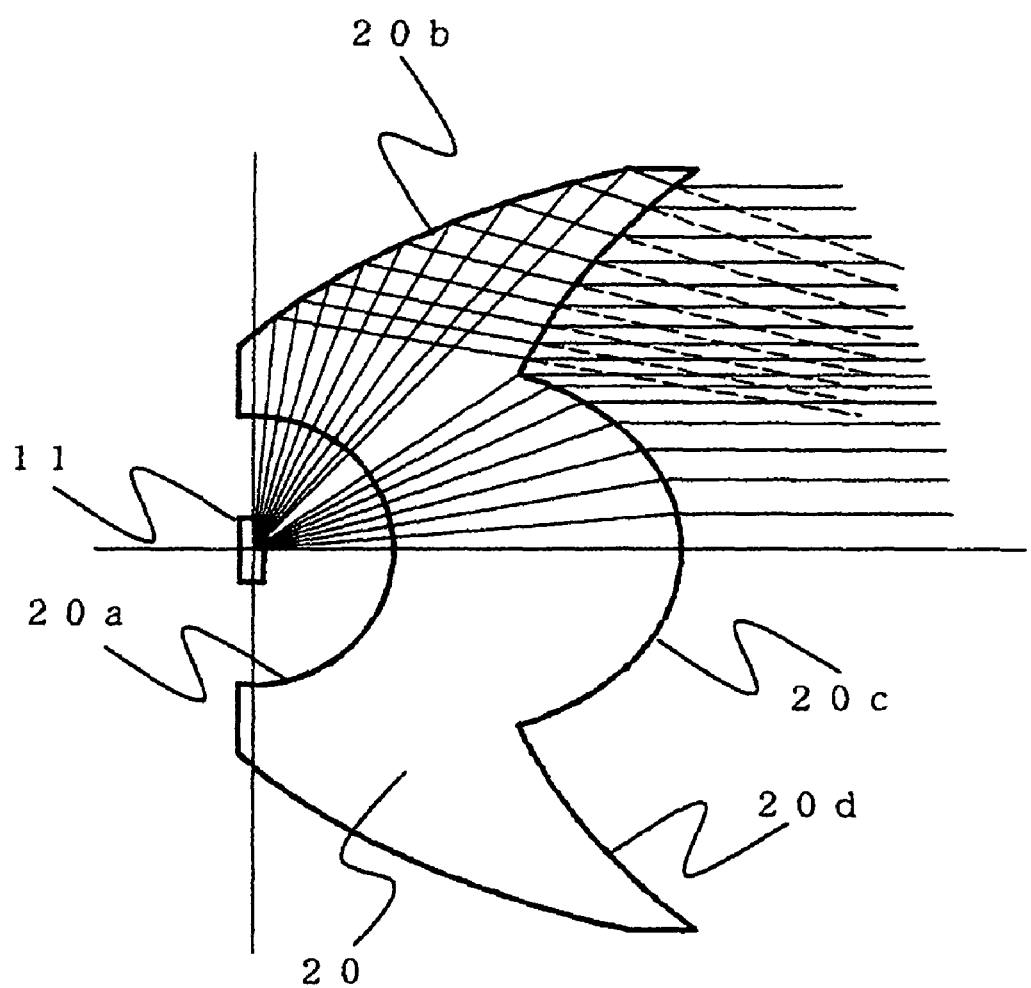
FIG. 3 is a view for explaining action of the collimator lens of the first embodiment.

FIG. 3 shows behaviors of light beams propagating in each collimator lens 20. Light fluxes emitted from the light source 10 are substantially perpendicularly incident to the spherical surface 20. Among the light fluxes, light beams having smaller angles formed with the optical axis are incident to and refracted by the ellipsoid 20c. When Expression (1) is satisfied, the ellipsoid 20c converts the light fluxes diverging from the light source located at the first focal point of the ellipsoid 20c into parallel light fluxes.

Light beams having larger angles formed with the optical axis are incident to and totally reflected by the ellipsoid 20b. At this point, the ellipsoid 20b converts the light fluxes diverging from the light source located at the first focal point of the ellipsoid 20b into light fluxes focused on the second focal point of the ellipsoid 20b. When Expression (1) is satisfied, the ellipsoid 20d converts the light fluxes focused on the second focal point of the ellipsoid 20d (that is, the second focal point of the ellipsoid 20b) into parallel light fluxes. Thus, each collimator lens 20 converts the light fluxes emitted from the light source into the substantially parallel light.

Figure 4:
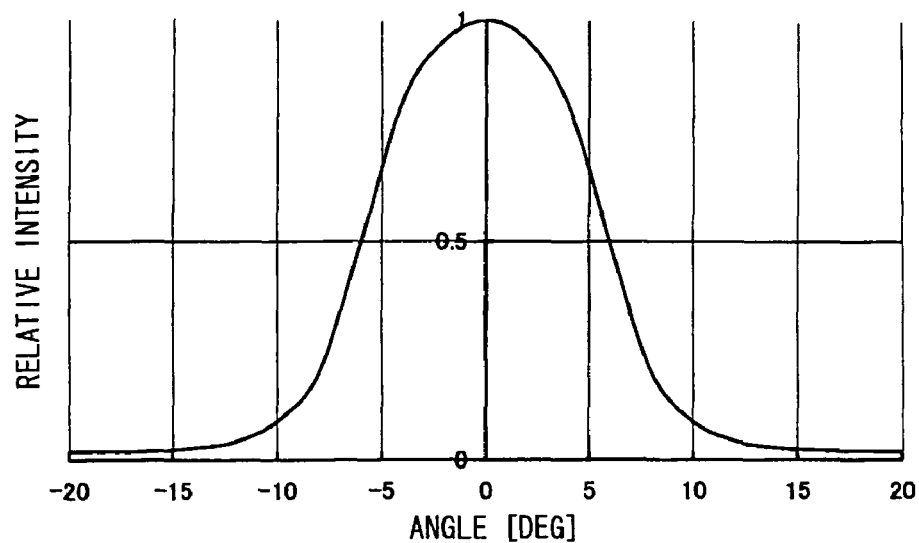
FIG. 4 is a view showing an emission angle characteristic of the illumination apparatus of the first embodiment.

FIG. 4 is a view showing numerical simulation result of an angle characteristic of the light emitted from each collimator lens 20. As can be seen from FIG. 4, after passing through each collimator lens 20, intensity of the light emitted from each LED 11 becomes a half of the intensity on the optical axis at a position which is located at an angle θ of about 6° from the optical axis. Thus, the light emitted from each LED 11 is converted into the light flux having the high directivity.

Then the high-directivity light flux exiting from the collimator lens 20 is incident to a rod integrator 30. The rod integrator 30 is a cube of 16 mm×16 mm×16 mm. Lights incident to the rod integrator 30 pass through the rod integrator 30 to form an homogeneous illuminance surface on an exit surface 30a of the rod integrator 30.

Figure 5:
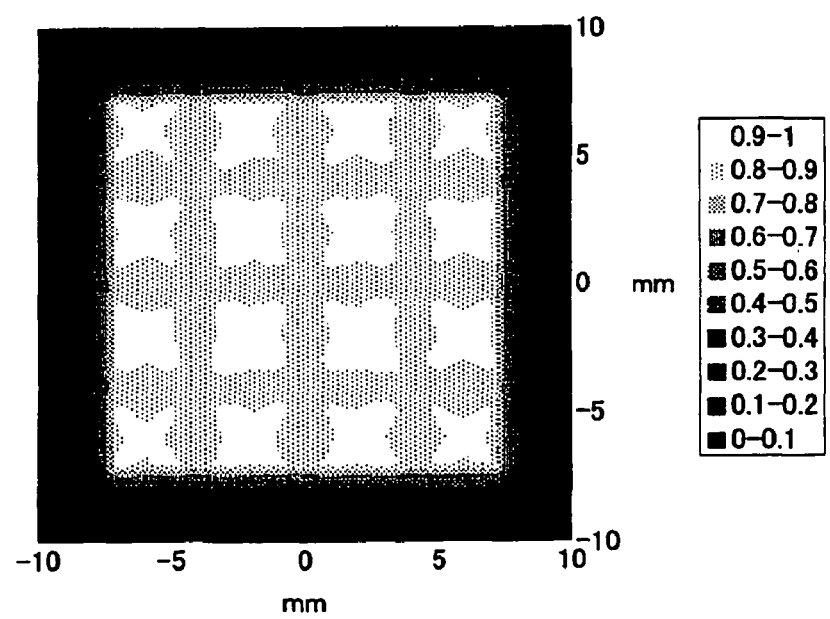
FIG. 5 is a view showing homogeneity of illumination surface intensity of the illumination apparatus of the first embodiment.

FIG. 5 is a view showing simulation result of the illuminance homogeneity on the exit surface 30a. As can be seen from FIG. 5, it is known that an illuminance difference falls within a range of ±10% in a region of 16 mm×16 mm around the optical axis. The illuminance difference is sufficiently smaller than the illuminance difference that can be perceived by human eyes. At this point, the rod integrator 30 has a length L of 16 mm, the space P between adjacent LEDs 11 is 4 mm, and the position at which the intensity of the light emitted from each LED 11 becomes a half of the intensity on the optical axis is located at an angle θ of about 6° from the optical axis. The length L of 16 mm of the rod integrator 30 is smaller than a half of length L of 38.1 mm enough to homogenize the light quantity distribution, which is disclosed and given by Expression (3) in Patent Document 1. Thus, in the first embodiment, the light quantity distribution can be homogenized by the short optical path length, and the more compact illumination apparatus can be formed.

In the first embodiment, preferably a gap between each LED 11 and the corresponding collimator lens 20 is filled with a medium whose refractive index n satisfies Expression (2) described below:

$$n_1 \geq n \geq n_2 \quad (2)$$

where $n_1$ is the refractive index of each LED 11. Therefore, the light flux that is trapped in each LED 11 by the total reflection on the surface of the LED 11 can be extracted to enhance light extraction efficiency of each LED 11.

Figure 6:
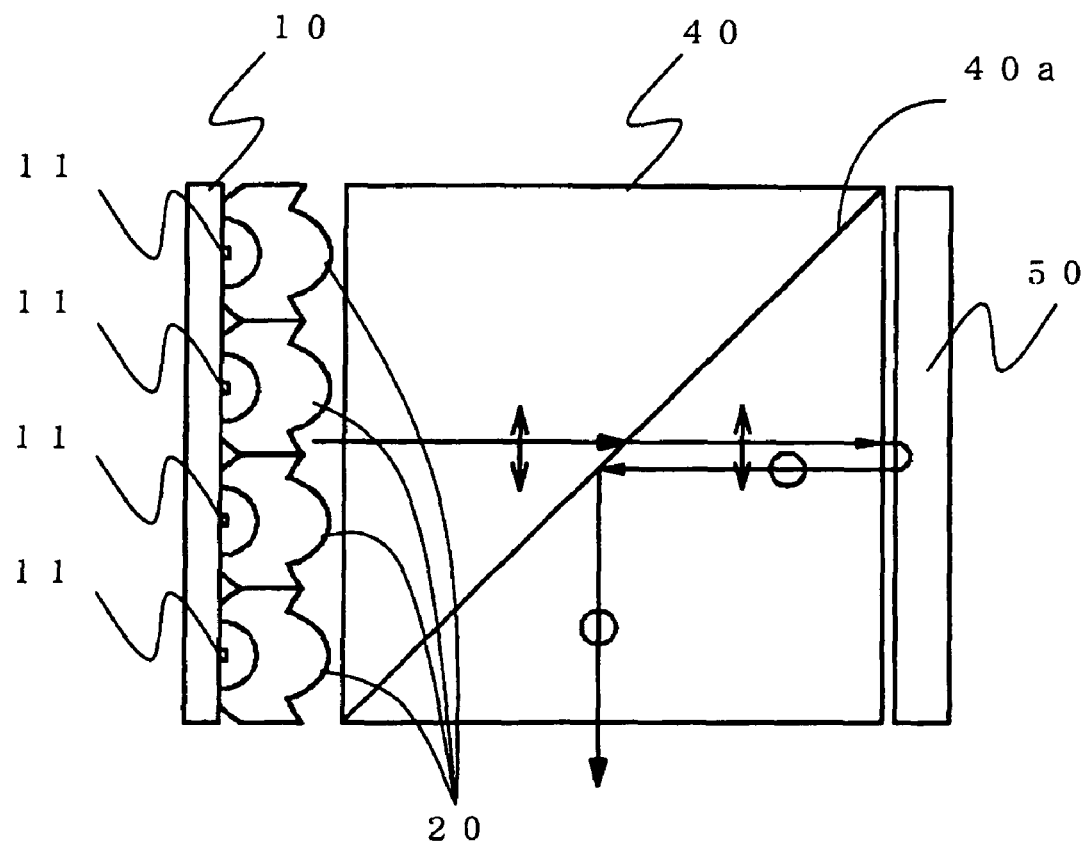
FIG. 6 is a view showing an example of an image forming apparatus (image projector) in which an illumination apparatus according to one of the embodiments is used.

An example of an image forming apparatus (image projector) in which the illumination apparatus according to an embodiment of the invention is used will be described with reference to FIG. 6. The image forming apparatus is an example in which a reflection type liquid crystal device is used as the optical modulator that forms an image. The configuration from each LED 11 to the corresponding collimator lens 20 is similar to that of the first embodiment, and the description is omitted.

The light flux converted into the substantially parallel light by each collimator lens 20 is incident to a polarization beamsplitter 40. The polarization beamsplitter is a cube of 16 mm×16 mm×16 mm. The light flux incident to the polarization beamsplitter 40 is separated into P-polarized light and S-polarized light by a polarization separation surface 40a. The P-polarized light is transmitted through, and the S-polarized light is reflected on the polarization separation surface. The P-polarized light is substantially homogenized through an optical path length of 16 mm of the polarization beamsplitter, and the P-polarized light is incident to a two-dimensional-array-shape reflection type liquid crystal device 50. In the reflection type liquid crystal device 50, the P-polarized light is subjected to different phase modulations at positions of elements, and the phase modulated P-polarized light is reflected. The phase-modulated light flux is incident to the polarization beamsplitter 40 again, only the S-polarized light corresponding to the phase-modulated quantity is reflected by the polarization separation surface 40a, and the image is formed. That is, the image can be formed by changing a degree of modulation of each element in the reflection type liquid crystal device 50. Thus, in the illumination apparatus of the embodiment, the light quantity distribution can be homogenized through the optical path length of the polarization beamsplitter 50, and the more compact illumination apparatus can be formed.

Figure 7:
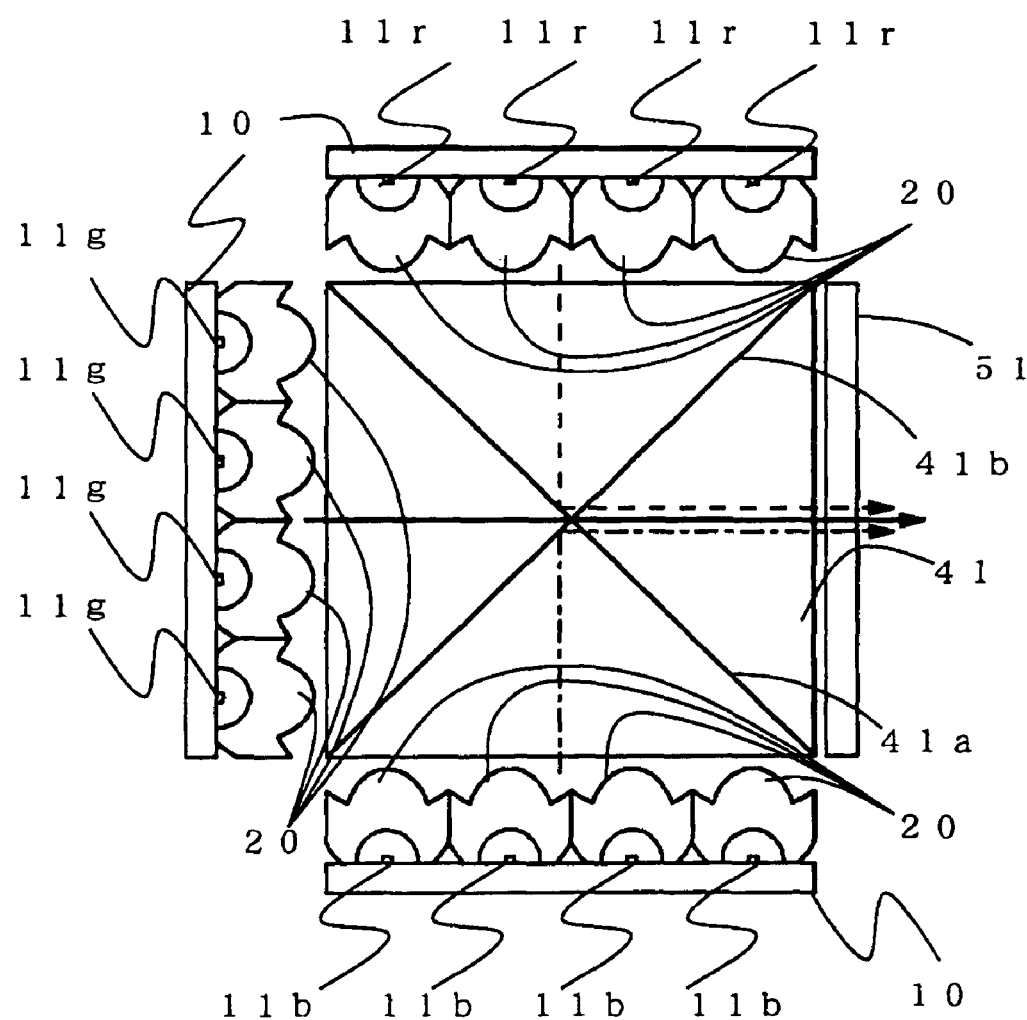
FIG. 7 is a view showing another example of an image forming apparatus (image projector) in which an illumination apparatus according to one of the embodiments is used.

Another example of the image forming apparatus (image projector) in which the illumination apparatus according to an embodiment of the invention is used will be described with reference to FIG. 7. The image forming apparatus of FIG. 7 is an example in which a transmission type liquid crystal device is used as the optical modulator, and the image forming apparatus is an example in which color display is performed using three colors of RGB. The configuration in which each collimator lens 20 converts the light beams emitted from a red LED 11r, a green LED 11g, and a blue LED 11b into the substantially parallel light beams is similar to that of the first embodiment, and the description is omitted.

The light fluxes emitted from the red LED 11r, green LED 11g, and blue LED 11b are converted into the substantially parallel light fluxes by the collimator lens 20, and the parallel light fluxes are incident to a cross dichroic prism 41. The cross dichroic prism 41 is a cube of 16 mm×16 mm×16 mm.

The light fluxes having the different colors are combined by the cross dichroic prism 41 and become the substantially homogenized light fluxes through an optical path length of 16 mm of the cross dichroic prism 41. Then the light fluxes are incident to a transmission type liquid crystal device 51, and transmission type liquid crystal device 51 forms the image. Thus, in the illumination apparatus of the embodiment, the light quantity distribution can be homogenized through the optical path length of the polarization beamsplitter 50, and the more compact illumination apparatus can be formed.

What is claimed is:

1. An illumination light source in which a plurality of solid-state light-emitting devices having a refractive index $n_1$ and a plurality of optical members having a refractive index $n_2$ are arrayed, each of the optical members converting a light flux emitted from the corresponding one of the solid-state light-emitting devices into substantially parallel light, wherein said each of the optical members comprises:

a first ellipsoid having focal points of a first point and a second point, the first point being located in a center the corresponding one of the solid-state light-emitting devices, the second point being different from the first point, the second point being located at a position advanced from the first point in a direction in which the light flux propagates;

a second ellipsoid having focal points of the first point and a third point, the third point being different from the first point, the third point being located a position advanced from the first point in the direction in which the light flux propagates; and a third ellipsoid having focal points of the second point and a fourth point, the fourth point being different from the second point, the fourth point being located on a light source side of the second point, wherein Expression (1) is satisfied:

$$\frac{1-e_2}{1+e_2} = \frac{1-e_3}{1+e_3} = \frac{n_2-1}{n_2+1} \quad (1)$$

where $e_2$ is an eccentricity of the second ellipsoid and $e_3$ is an eccentricity of the third ellipsoid.

2. The illumination light source according to claim 1, wherein n satisfies Expression (2):

$$n_1 \geq n \geq n_2 \quad (2)$$

where n is a refractive index of a medium with which a gap between said each of the optical members and the corresponding one of the solid-state light-emitting devices is filled.

3. The illumination light source according to claim 1, wherein the illumination light source is disposed on a non-metallic radiator board.

4. The illumination light source according to claim 3, wherein the non-metallic radiator board is an oriented graphite sheet, and an integrated array including the solid-state light-emitting devices and the optical members is bonded onto the oriented graphite sheet with a thermal conductive resin.

5. The illumination light source according to claim 1, wherein said each of the optical members is a heat-resistant resin optical member, and the plurality of optical members are bonded into an integrated array shape with a thermal conductive resin.

6. The illumination light source according to claim 5, wherein the heat-resistant resin optical member is one of heat-resistant acryl, polycarbonate, polyethylene terephthalate, and cycloolefin polymer.

7. The illumination light source according to claim 1, further comprising a rod integrator.

8. An image projector that projects an image according to input image information, the image projector comprising:

an illumination light source as in claim 1;

a spatial modulator that modulates an image according to the input image information;

an illumination optical system that guides illumination light emitted from the illumination light source to illuminate the spatial modulator; and a projection optical system that projects the image modulated by the spatial modulator illuminated with the illumination optical system.

* * * * *